United States Patent [19]

Sitzler

[11] Patent Number: 5,002,507
[45] Date of Patent: Mar. 26, 1991

[54] CIRCUIT BOARD CONTACT ELEMENT AND COMPLIANT SECTION THEREOF

[75] Inventor: Fred C. Sitzler, Hanover, Pa.

[73] Assignee: E. I. Du Pont de Nemours and Company, Wilmington, Del.

[21] Appl. No.: 472,903

[22] Filed: Jan. 31, 1990

[51] Int. Cl.⁵ ............................................. H01R 13/41
[52] U.S. Cl. ........................................ 439/751; 439/84
[58] Field of Search ............................. 439/82, 84, 751

[56] References Cited

U.S. PATENT DOCUMENTS

| | | | |
|---|---|---|---|
| 3,601,750 | 8/1971 | Mancini | 339/17 |
| 3,783,433 | 1/1974 | Kurtz et al. | 439/82 |
| 3,792,412 | 2/1974 | Madden | 439/82 |
| 4,206,964 | 6/1980 | Olsson | 339/221 |
| 4,548,450 | 10/1985 | Reimer et al. | 439/82 |
| 4,655,537 | 4/1987 | Andrews, Jr. | 339/221 |
| 4,684,203 | 8/1987 | Bibler | 439/751 |
| 4,728,164 | 3/1988 | Lemmens et al. | 439/870 |

FOREIGN PATENT DOCUMENTS 3120629 12/1982 Fed. Rep. of Germany .

Primary Examiner—Eugene F. Desmond
Attorney, Agent, or Firm—John E. Griffiths

[57] ABSTRACT

The present invention relates to circuit board contact elements and compliant sections thereof which are mounted in plated-through holes in printed circuit boards, generally in conjunction with a plastic header or other electrical connectors.

21 Claims, 3 Drawing Sheets

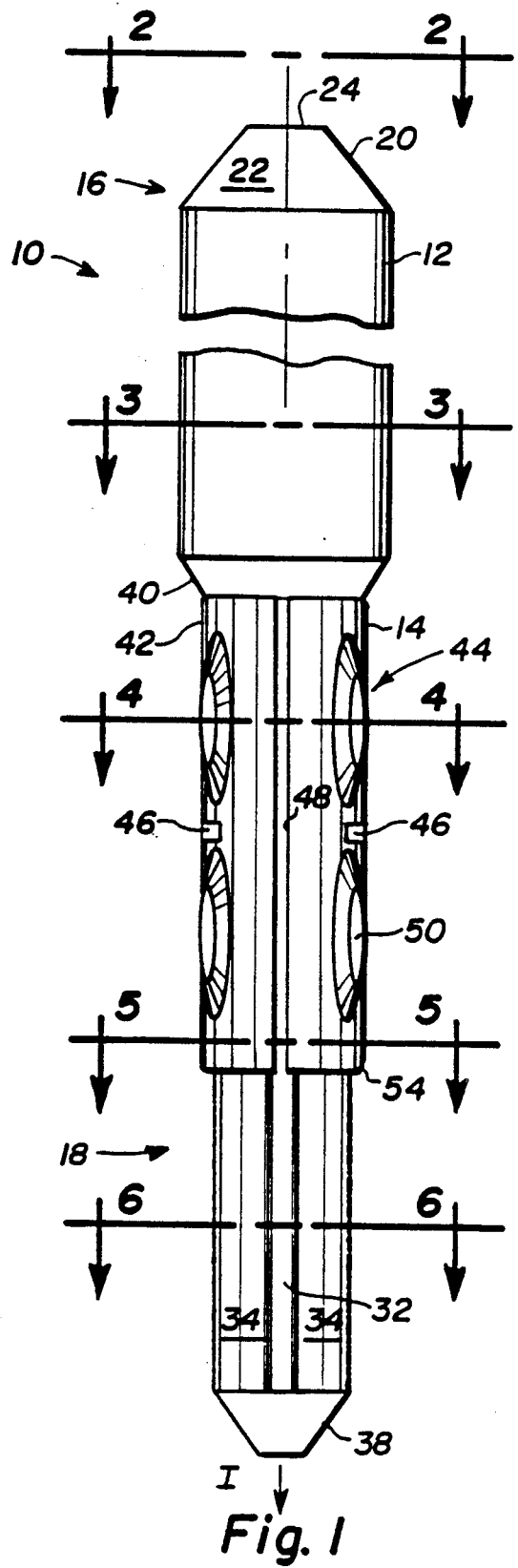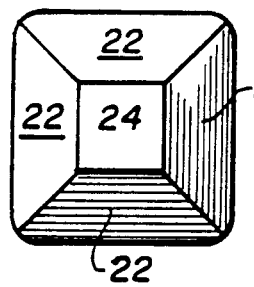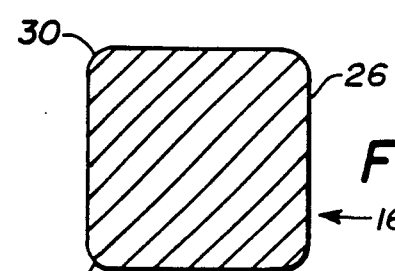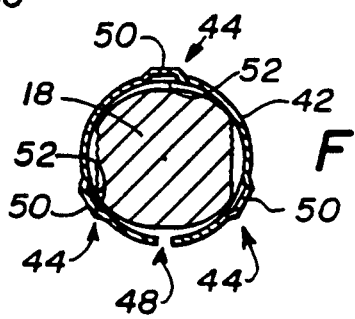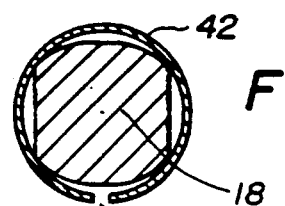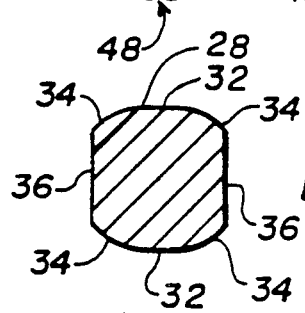

CIRCUIT BOARD CONTACT ELEMENT AND COMPLIANT SECTION THEREOF

BACKGROUND OF THE INVENTION

1. Field of the Invention

This invention relates to circuit board contact elements and compliant sections thereof which are for mounting in plated-through holes in printed circuit boards, generally in conjunction with a header or other electrical connectors.

2. Description of Related Art

Electrical contacts, terminals or pins are used in the electronics industry in conjunction with printed circuit (PC) boards and panel boards for making electrical connections between, and among, circuits. The contacts have one end for making electrical contact with a conductive path on the PC board. The contacts have another end for electrical connection elsewhere. Many of the contacts have a compliant, contact or press fit end or section for forcing into a plated hole through the board deforming the compliant section. This results in an interference fit which is relied upon to hold the contact in the board and to provide an electrical connection between the contact and the material plating the hole. Such connections are solderless. It is also common to use multi-contact electrical connectors for connection to a printed circuit board or the like where each of the contacts has a compliant section.

In the past, the centers of holes in a circuit board were spaced about 0.1 inches (or about 2.540 mm) apart. The standard hole size in a printed circuit board was about 0.040 inches (or about 1 mm) in diameter with a manufacturing tolerance of plus or minus about 0.002 inches (or about 0.051 mm). A standard contact used for this size hole has a compliant section with a maximum dimension transverse to the insertion direction of 0.046 inches (or 1.18 mm). The compliant section deforms when forced into the hole. In order to be used for holes throughout the tolerance range, the contact only needs to be capable of deforming from about 10% up to about 21% of its maximum transverse thickness, i.e., its distance from one of its corners to its far corner. U.S. Pat. Nos. 4,655,537, 4,206,964 and 4,728,164 disclose contacts for mounting in traditional size holes having a diameter of 0.040 inches (or 1 mm) or greater.

To increase the number of electrical connections per unit area on a circuit board, boards have recently been produced with holes spaced about 0.050 inches (or about 1.27 mm) apart from center to center. If the hole size remained the same for such a board, the space on the board for providing conductive paths and insulative portions would be insufficient for most applications. As such, smaller hole sizes are desired or planned having diameters of about 0.024 inches (or about 0.6 mm) plus or minus about 0.004 inches (or about 0.1 mm) to provide more space for the conductive paths and insulative portions. Of course, whatever hole diameter is specified, manufacturers will still only be able to produce such holes with a tolerance of plus or minus about 0.002 inches (or about 0.051 mm). Furthermore, boards are being proposed much thinner than before. As a result, new smaller contacts are needed for connection to the smaller holes and thinner PC boards.

However, making the contacts smaller makes them more flexible and more likely to bend or distort. Furthermore, manufacturers of the boards still require a tolerance of plus or minus about 0.002 inches (or 0.051 mm) in making the holes. As a result, the contacts must now be capable of deforming at least 30% of its maximum transverse thickness. In other words, contacts must now be capable of press fitting and, thus, being retained by an interference fit in holes varying more in diameter in comparison to the size of the contact than previously existing contacts.

In view of these facts, it is desirable to provide a contact element and a compliant section thereof for insertion and conforming to holes having a large tolerance in relation to the hole size and, in particular, to small holes having a large tolerance.

SUMMARY OF THE INVENTION

The present invention relates to an electrical contact element for mechanical and electrical connection with a plated-through hole in a printed circuit board comprising:

a pin having a force receiving end portion and an insertion end portion, the force receiving end portion having a first cross sectional area transverse to the insertion direction of the pin as great or greater than a second cross sectional area of the insertion end portion and transverse to the insertion direction of the pin; and a compliant section comprising a tubular sleeve connected around the insertion end portion, the tubular sleeve having at least one projection extending away from the pin, whereby when the insertion end portion is inserted into a plated-through hole which has a diameter which is less than a diameter of a circle intersecting the outer points of the perimeter of the sleeve transverse to the insertion direction, the projection is deformed so that the contact element is retained in, without significantly damaging, the plated-through hole.

The present invention can be further described as being directed to a compliant section for mechanical and electrical connection between a plated-through hole in a printed circuit board and a pin having a force receiving end portion and an insertion end portion, the force receiving end portion having a first cross sectional area transverse to the insertion direction of the pin as great or greater than a second cross sectional area of the insertion end portion and transverse to the insertion direction of the pin, the compliant section comprising:

a tubular sleeve for connection around the insertion end portion, the tubular sleeve having at least one projection for extending away from the pin, whereby when the tubular sleeve is connected around the insertion end portion and the insertion end portion is inserted into a plated-through hole which has a diameter which is less than a diameter of a circle intersecting the outer points of the perimeter of the sleeve transverse to the insertion direction, the projection is deformed so that the contact element is retained in, without significantly damaging, the plated-through hole.

BRIEF DESCRIPTION OF THE DRAWINGS

The invention can be more fully understood from the following detailed description thereof in connection with accompanying drawings which form a part of this application and in which:

FIG. 1 is a side view of an electrical contact element having a compliant section in accordance with the present invention.

FIG. 2 is a plan view of the contact element illustrated in FIG. 1 taken along line 2—2 in the direction of the arrows.

FIG. 3 is a cross sectional view of the contact element illustrated in FIG. 1 taken along line 3—3 in the direction of the arrows.

FIG. 4 is a cross sectional view of the contact element illustrated in FIG. 1 taken along line 4—4 in the direction of the arrows.

FIG. 5 is a cross sectional view of the contact element illustrated in FIG. 1 taken along line 5—5 in the direction of the arrows.

FIG. 6 is a cross sectional view of the contact element illustrated in FIG. 1 taken along line 6—6 in the direction of the arrows.

DESCRIPTION OF THE PREFERRED EMBODIMENT(S)

Figure 7:
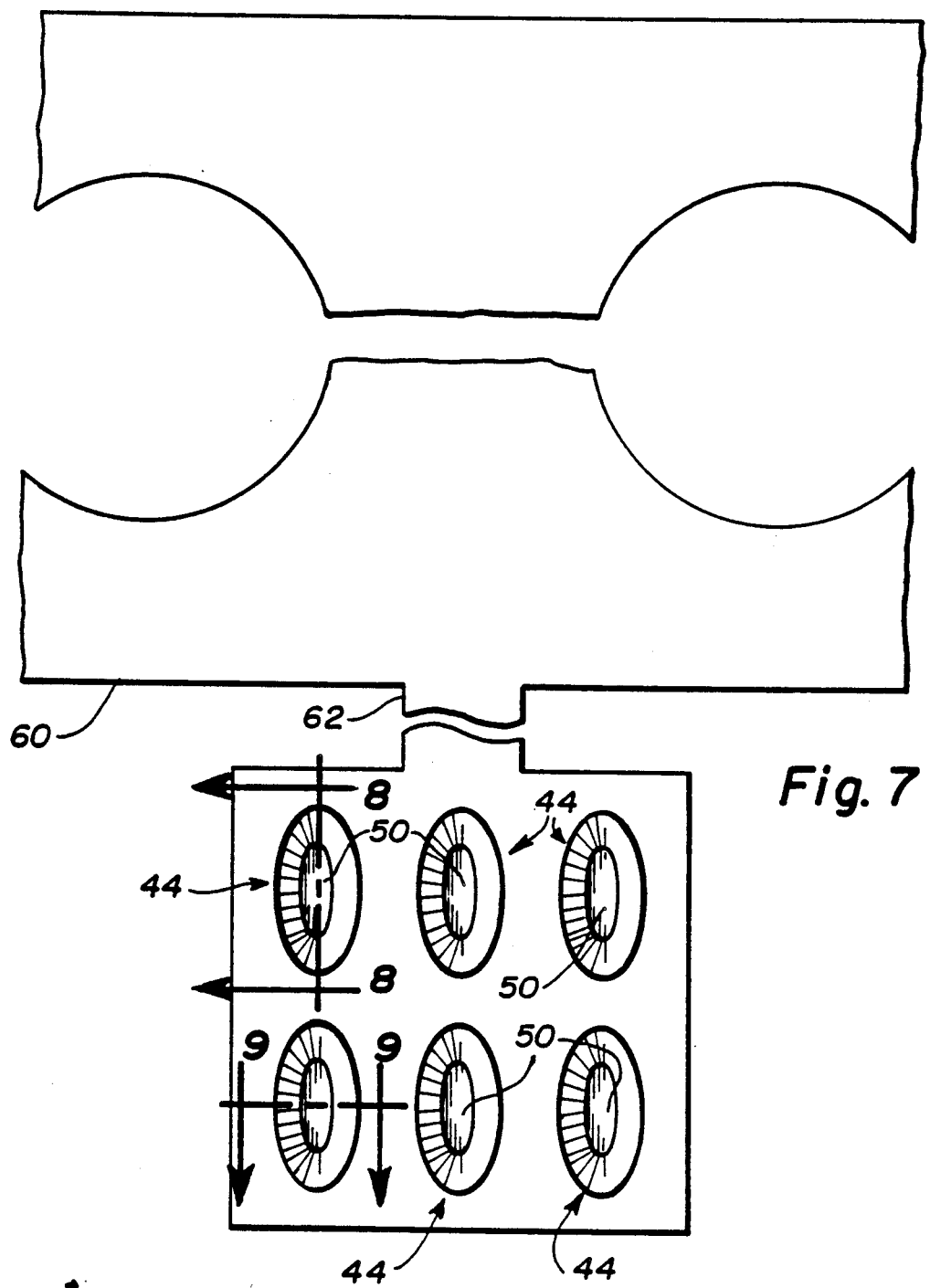
FIG. 7 illustrates a sleeve in accordance with the present invention in a flat stage attached to a carrying strip.

Throughout the following detailed description, similar reference numerals refer to similar elements in all Figures of the drawings.

Referring to FIG. 1, there is illustrated a side view of an electrical contact element 10 for mechanical and electrical connection with a plated-through hole in a printed circuit board in accordance with the present invention. The electrical contact element 10 comprises an electrical contact, terminal or pin 12 and a compliant section 14.

The pin 12 can be a straight or stepped pin 12. The pin 12 is illustrated as a stepped pin in FIG. 1. The pin 12 may comprise a force receiving end portion 16 and an insertion end portion 18. The force receiving end portion 16 may have a force receiving end 20 with four substantially equal shaped symmetric inclined sides 22 that connect to a flat surface 24 for receiving the force for inserting the element 10 into the hole. The sides 22 and surface 24 are illustrated in FIG. 2 which is a plan view of the contact element 10 illustrated in FIG. 1 taken along line 2—2 in the direction of the arrows.

The force receiving end portion 16 has a first cross sectional area 26 transverse to the insertion direction (indicated by the direction of arrow I in FIG. 1) of the pin 10. The first cross sectional area 26 is illustrated in FIG. 3 which is a cross sectional view of the contact element 10 illustrated in FIG. 1 taken along line 3—3 in the direction of the arrows. The insertion end portion 18 has a second cross sectional area 28 transverse to the insertion direction I of the pin 10. The second cross sectional area 28 is illustrated in FIG. 6 which is a cross sectional view of the contact element 10 illustrated in FIG. 1 taken along line 6—6 in the direction of the arrows. The first cross sectional area 26 of the force receiving end portion 16 is as great or greater than the second cross sectional area 28 of the insertion end portion 18.

The first cross sectional area 26 may be round, substantially round, square or substantially square. FIG. 3 depicts the first cross sectional area 26 as being substantially square. The first cross sectional area 26 may have rounded corners 30. The second cross sectional area 28 is circular or substantially circular, but its circumference or perimeter may have straight portions 32, curved portions 34 or rough portions 36 depending, for instance, on how the pin 10 is made.

The insertion end portion 18 may have a tapered or conical insertion end 38 which tapers down towards the insertion direction I. Further, the insertion end portion 18 may have a transition section 40 connected between the force receiving end portion 16 and the insertion end portion 18.

Preferably, the first cross sectional area 26 is made 0.025 inches (0.635 mm) plus or minus 0.0003 inches (0.0076 mm) square. Preferably, the second cross sectional area 28 is or is about circular and has a diameter of at least 0.004 inches (0.10 mm) smaller than the printed circuit board hole diameter that it is used on. The length of the insertion end portion 18 is variable depending on the thickness of the printed circuit board that it is used on.

An illustrative pin suitable for use in the present invention is commercially available from Precision Concepts, Inc., with offices at Shirley, N.Y. under part number FL-25-XXX-XXX.

The compliant section 14 of the present invention comprises a tubular sleeve 42 connected around the insertion end portion 18 of the pin 12. The tubular sleeve 42 has at least one projection 44 extending radially away from the pin 12.

Preferably, there are at least three of the projections 44 spaced equally around the sleeve 42 and positioned on a plane transverse to the insertion direction I. FIG. 4 illustrates a cross sectional view of one such plane through the contact element 10 illustrated in FIG. 1 taken along line 4—4 in the direction of the arrows. Further, preferably there are at least three of the projections spaced equally around the sleeve positioned on each of at least two planes transverse to the insertion direction. FIG. 1 depicts two planes transverse to the insertion direction with at least three of the projections 44 spaced equally around the sleeve 42. Preferably, the projections 44 in each such plane are substantially the same shape and size. Furthermore, for convenience of manufacturing, preferably, all of the projections 44 in all such planes are substantially the same shape and size.

FIG. 5 is a cross sectional view of the contact element illustrated in FIG. 1 taken along line 5—5 in the direction of the arrows. FIG. 5 illustrates that the sleeve 42 is cylindrical or substantially cylindrical where there are no projections 44.

Preferably, the sleeve 42 is mechanically and electrically connected to the pin 12 between two of the transverse planes. For instance, areas 46 of the sleeve 42 between the two transverse planes can be crimped or squeezed into the pin 12.

Furthermore, the sleeve 42 preferably has a nonconnected seam 48 extending along the longitudinal or insertion direction I of the pin 12 such that the seam 48 allows the sleeve 42 to flexibly expand around the insertion end portion 18 of the pin 12 when the perimeter of the insertion end portion 18 is slightly larger than the inner circumference of the sleeve 42.

Moreover, the sleeve 42 preferably has an inclined end 54 to facilitate insertion into the hole.

Figure 8:
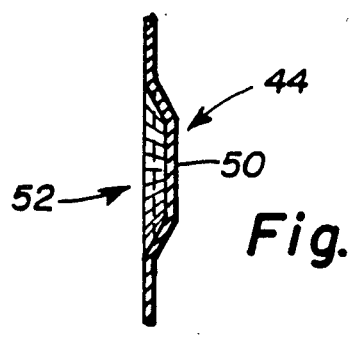
FIG. 8 is a cross sectional view of an embossed bump or projection in the sleeve illustrated in FIG. 7 taken along line 8—8 in the direction of the arrows.
Figure 9:
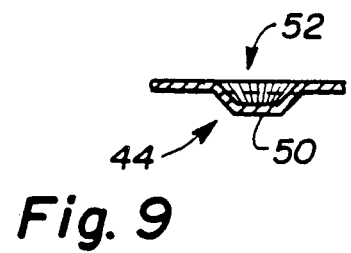
FIG. 9 is a cross sectional view of an embossed bump or projection in the sleeve illustrated in FIG. 7 taken along line 9—9 in the direction of the arrows.

Preferably, each projection 44 has a substantially flat area 50 on its surface furthest from the pin 12. The flat area 50 reduces damage to the plating in the hole when inserted therein. However, the harder the plating, the smaller the flat area 50 can be. In fact, if the plating is a very hard material, then it may not be significantly better to have the flat area 50. The sleeve 42 further preferably has an indentation 52 extending into the projection 44 from the inside of the sleeve 42. Further, the projection 44 is preferably elongated in the longitudinal or insertion direction I of the pin 12 for stability in the hole. See FIGS. 8 and 9.

The projection 50 can be an annular rib transverse to the insertion direction I, but one or more bumps 50 as illustrated in FIGS. 1 and 4 is preferred. Use of bumps 50, rather than ribs, reduces the required force to insert the element 10 into a hole.

The compliant section 14 of the present invention can be made any size, e.g., the length, width, and thickness can be modified, to accommodate most, if not all, hole sizes and board thicknesses. Furthermore, the compliant section 14 of the present invention can be made sufficiently deformable to retain its contact element 10 in a hole having a diameter of about 0.024 inches (or about 0.6 mm) with a hole tolerance of plus or minus 0.002 inches (or 0.051 mm). Moreover, the compliant section 14 of the present invention is capable of deforming in one cross section transverse to its insertion direction at least 30% of its maximum transverse dimension or thickness, $D_{max}$. For the purposes of this invention, the maximum transverse dimension or thickness, $D_{max}$, of the compliant section 14 is defined to be the largest diameter of a circle (designated by the number 64 in FIG. 11) intersecting the outer points of the perimeter of the sleeve 42 transverse to the insertion direction I.

Thus, when the insertion end portion 18 is inserted into a plated-through hole which has a diameter which is less than the maximum transverse dimension or thickness, $D_{max}$, 64, the projection 44 is deformed so that the contact element 10 is retained in, without significantly damaging, the plated-through hole.

Contact elements or terminals 10 having a compliant section 14 in accordance with the present invention may be individually press fit in or staked within a plated hole in a printed circuit board. Alternatively, contact elements or terminals 10 having a compliant section 14 in accordance with the present invention may be assembled or molded to a plastic header, shroud or housing and then press fit into plated holes in a printed circuit board. If ends of the contact elements or terminals 10 are not shaped to receive insertion force, e.g., when the end is a bent spring, then the staking force can be applied through a header, shroud or housing to shoulders or other means.

The compliant section 14 of the present invention can be described as having a cross section that is capable of deforming in one cross section transverse to its insertion direction at least 30% of its maximum transverse dimension, $D_{max}$. This deformability enables the compliant section 14 of the present invention to be press fit into holes having desired, planned or specified diameters in the range of about 0.020 inches through 0.028 inches (or about 0.5 mm through 0.7 mm) made with a manufacturing tolerance of plus or minus about 0.002 inches (or about 0.051 mm). Note, however, that the compliant section need not, and typically does not, deform up to its maximum feasible limit in order to result in an adequate interference fit in the hole.

The compliant section 10 of the present invention can be made by first stamping out a plurality of the sleeves 42 in a flat stage attached to a carrying or magizine strip 60 by an extension 62. See FIG. 7. Second, the projections or bumps 44 are formed or embossed in the sleeves 42. Third, the sleeves 42 are made cylindrical in a manner known in the art while still attached to the magizine strip 60. See FIG. 10. A nick can be made at the junction between the sleeve 42 and the extension 62, such as, on the outside of the sleeve 42 to allow the sleeve to break off the extension without a burr. Then the sleeve 42 can be slid on and crimped to the insertion end portion 18 of the pin 12.

Figure 10:
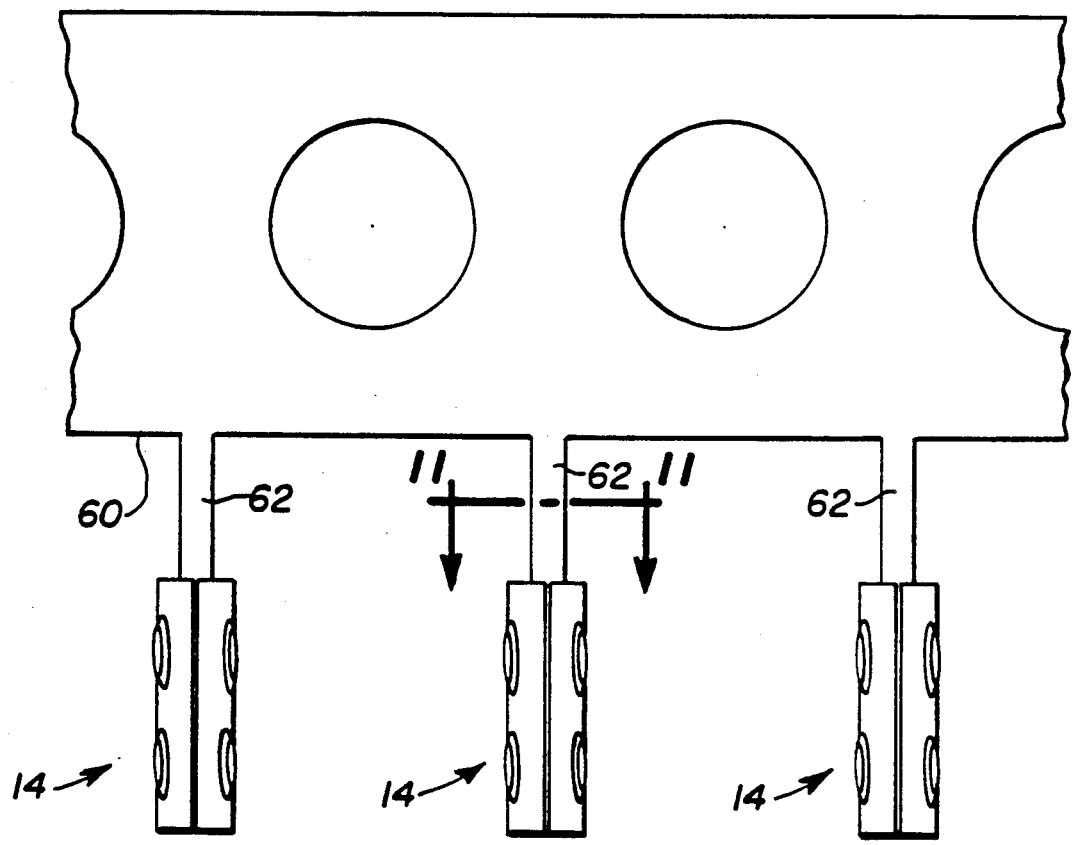
FIG. 10 illustrates a plurality of sleeves in accordance with the present invention in a curved stage attached to a carrying strip.
Figure 11:
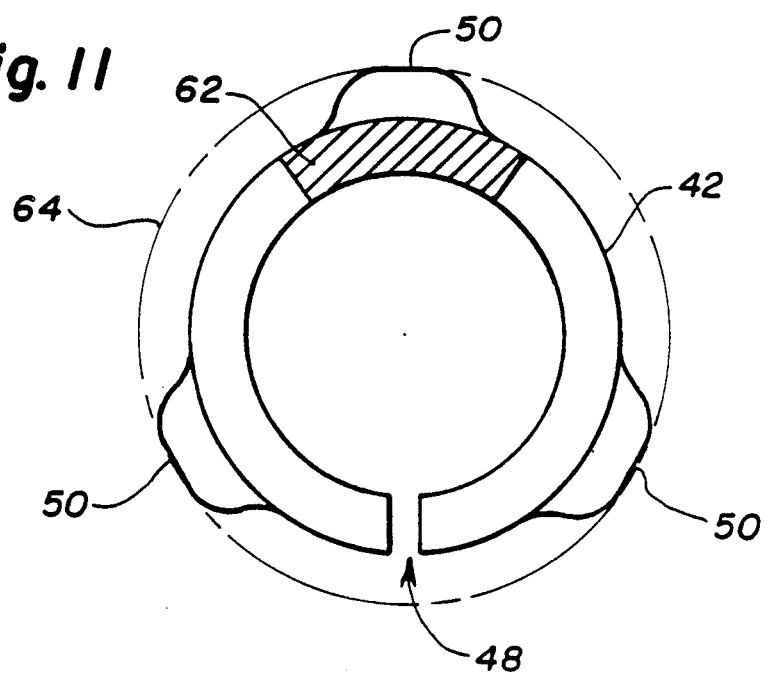
FIG. 11 is an enlarged cross sectional view directed towards an end of one of the sleeves illustrated in FIG. 10 taken along line 11—11 in the direction of the arrows.

FIG. 11 is an enlarged cross sectional view directed towards an end of one of the sleeves illustrated in FIG. 10 taken along line 11—11 in the direction of the arrows. FIG. 11 illustrates that the projections 44 preferably have a curved or rounded side. However, the sides of the projections 44 can be conical.

Preferably, the sleeve 42 is about 0.070 inches (1.78 mm) long in the insertion direction I; the inner diameter of the sleeve 42 is about 0.018 inches (0.457 mm); the outer diameter of the sleeve 42 at the cross section illustrated in FIG. 5 is about 0.022 inches (0.056 mm); and the maximum transverse dimension or thickness, $D_{max}$, 64 is about 0.030 inches (0.76 mm).

The contact elements of the present invention can be made from any suitable metal used for electrical terminals, such as brass, phosphor bronze, beryllium copper and the like. The contact elements may be plated or coated with a conductive layer, such as tin, nickel, pladium, gold, silver or a suitable alloy.

Those skilled in the art, having the benefit of the teachings of the present invention as hereinabove set forth, can effect numerous modifications thereto. These modifications are to be construed as being encompassed within the scope of the present invention as set forth in the appended claims.

I claim:

1. An electrical contact element for mechanical and electrical connection with a plated-through hole in a printed circuit board comprising:
    a pin having a force receiving end portion and an insertion end portion, the force receiving end portion having a first cross sectional area transverse to the insertion direction of the pin as great or greater than a second cross sectional area of the insertion end portion and transverse to the insertion direction of the pin; and
    a compliant section comprising a tubular sleeve connected around the insertion end portion, the tubular sleeve having an outer cylindrical surface with a first projection, a second projection and a third projection, a fourth projection, a fifth projection and a sixth projection,
    each of the projections extending away from the pin,
    the first, second and third projections spaced equally around the sleeve and positioned on a first plane transverse to the insertion direction, and
    the fourth, fifth and sixth projections spaced equally around the sleeve positioned on a second plane transverse to the insertion direction and not positioned on the first plane, whereby when the compliant section is forced into a plated-through hole which has a diameter which is less than a diameter of a circle intersecting the outer points of the perimeter of the sleeve transverse to the insertion direction, the projections are deformed resulting in an interference fit between the compliant section and the plated-through hole within the hole so that the contact element is retained by the interference fit, in without significantly damaging, the plated-through hole.

2. The element of claim 1, wherein the compliant section is capable of deforming transverse to its insertion direction about 30% of its maximum transverse dimension.

3. The element of claim 1, further comprising an insertion end having a conical outer surface for easy initial positioning in the hole.

4. The element of claim 1, wherein the compliant section is sufficiently deformable to retain the contact element in a hole having a diameter in the range of about 0.020 inches through 0.028 inches (or about 0.5 mm through 0.7 mm) made with a manufacturing tolerance of plus or minus about 0.002 inches (or about 0.051 mm).

5. The element of claim 1, wherein the sleeve is connected to the pin between the first and second transverse planes.

6. The element of claim 1, wherein the sleeve has a nonconnected seam extending along the longitudinal direction of the pin such that the seam allows the sleeve to flexibly expand around the insertion end portion of the pin when the perimeter of the insertion end portion is slightly larger than the inner circumference of the sleeve.

7. The element of claim 1, wherein the projections are elongated in the longitudinal direction of the pin.

8. The element of claim 1, wherein the sleeve has an inclined end to facilitate insertion into the hole.

9. The element of claim 1, wherein the projections are bumps.

10. The element of claim 1, wherein:
the first and fourth projections intersect a first longitudinal plane containing a longitudinal axis of the sleeve;
the second and fifth projections intersect a second longitudinal plane containing the longitudinal axis of the sleeve; and
the third and sixth projections intersect a third longitudinal plane containing the longitudinal axis of the sleeve.

11. An electrical contact element for mechanical and electrical connection with a plated-through hole in a printed circuit board comprising:
a pin having a force receiving end portion and an insertion end portion, the force receiving end portion having a first cross sectional area transverse to the insertion direction of the pin as great or greater than a second cross sectional area of the insertion end portion and transverse to the insertion direction of the pin; and
a compliant section comprising a tubular sleeve connected around the insertion end portion, the tubular sleeve having at least one projection extending away from the pin, wherein the projection has a substantially flat area on its surface furthest from the pin,
whereby when the insertion end portion is inserted into a plated-through hole which has a diameter which is less than a diameter of a circle intersecting the outer points of the perimeter of the sleeve transverse to the insertion direction, the projection is deformed so that the contact element is retained in, without significantly damaging, the plated-through hole.

12. An electrical contact element for mechanical and electrical connection with a plated-through hole in a printed circuit board comprising:
a pin having a force receiving end portion and an insertion end portion, the force receiving end portion having a first cross sectional area transverse to the insertion direction of the pin as great or greater than a second cross sectional area of the insertion end portion and transverse to the insertion direction of the pin; and
a compliant section comprising a tubular sleeve connected around the insertion end portion, the tubular sleeve having at least one projection extending away from the pin, wherein the sleeve has an indentation extending into the projection from the inside of the sleeve,
whereby when the insertion end portion is inserted into a plated-through hole which has a diameter which is less than a diameter of a circle intersecting the outer points of the perimeter of the sleeve transverse to the insertion direction, the projection is deformed so that the contact element is retained in, without significantly damaging, the plated-through hole.

13. A compliant section for mechanical and electrical connection between a plated-through hole in a printed circuit board and a pin having a force receiving end portion and an insertion end portion, the force receiving end portion having a first cross sectional area transverse to the insertion direction of the pin as great or greater than a second cross sectional area of the insertion end portion and transverse to the insertion direction of the pin, the compliant section comprising:
a tubular sleeve for connection around the insertion end portion, the tubular sleeve having an outer cylindrical surface with a first projection, a second projection and a third projection, a fourth projection, a fifth projection and a sixth projection,
each of the projections extending away from the pin,
the first, second and third projections spaced equally around the sleeve and positioned on a first plane transverse to the insertion direction, and
the fourth, fifth and sixth projections spaced equally around the sleeve positioned on a second plane transverse to the insertion direction and not positioned on the first plane,
whereby when the tubular sleeve is connected around the insertion end portion and the sleeve is forced into a plated-through hole which has a diameter which is less than a diameter of a circle intersecting the outer points of the perimeter of the sleeve transverse to the insertion direction, the projections are deformed resulting in an interference fit between the compliant section and the plated-through hole within the hole so that the contact element is retained by the interference fit in, without significantly damaging, the plated-through hole.

14. The compliant section of claim 13, wherein the sleeve has an area for connection to the pin between the first and second transverse planes.

15. The compliant section of claim 13, wherein the sleeve has a nonconnected seam extending along the longitudinal direction of the section such that the seam allows the sleeve to flexibly expand around the insertion end portion of the pin when the perimeter of the insertion end portion is slightly larger than the inner circumference of the sleeve.

16. The compliant section of claim 13, wherein the projections are elongated in the longitudinal direction of the section.

17. The compliant section of claim 13, wherein the sleeve has an inclined end to facilitate insertion into the hole.

18. The compliant section of claim 13, wherein the projections are bumps.

19. The compliant section of claim 13, wherein:
the first and fourth projections intersect a first longitudinal plane containing a longitudinal axis of the sleeve;
the second and fifth projections intersect a second longitudinal plane containing the longitudinal axis of the sleeve; and
the third and sixth projections intersect a third longitudinal plane containing the longitudinal axis of the sleeve.

20. A compliant section for mechanical and electrical connection between a plated-through hole in a printed circuit board and a pin having a force receiving end portion and an insertion end portion, the force receiving end portion having a first cross sectional area transverse to the insertion direction of the pin as great or greater than a second cross sectional area of the insertion end portion and transverse to the insertion direction of the pin, the compliant section comprising:
a tubular sleeve for connection around the insertion end portion, the tubular sleeve having at least one projection for extending away from the pin, wherein the projection has a substantially flat area on its surface at its peak,
whereby when the tubular sleeve is connected around the insertion end portion and the insertion end portion is inserted into a plated-through hole which has a diameter which is less than a diameter of a circle intersecting the outer points of the perimeter of the sleeve transverse to the insertion direction, the projection is deformed so that the contact element is retained in, without significantly damaging, the plated-through hole.

21. A compliant section for mechanical and electrical connection between a plated-through hole in a printed circuit board and a pin having a force receiving end portion and an insertion end portion, the force receiving end portion having a first cross sectional area transverse to the insertion direction of the pin as great or greater than a second cross sectional area of the insertion end portion and transverse to the insertion direction of the pin, the compliant section comprising:
a tubular sleeve for connection around the insertion end portion, the tubular sleeve having at least one projection for extending away from the pin, wherein the sleeve has an indentation extending into the projection from the inside of the sleeve,
whereby when the tubular sleeve is connected around the insertion end portion and the insertion end portion is inserted into a plated-through hole which has a diameter which is less than a diameter of a circle intersecting the outer points of the perimeter of the sleeve transverse to the insertion direction, the projection is deformed so that the contact element is retained n, without significantly damaging, the plated-through hole.

* * * * *